United States Patent
Toda et al.

(10) Patent No.: US 11,764,070 B2
(45) Date of Patent: Sep. 19, 2023

(54) ETCHING METHOD AND ETCHING APPARATUS

(71) Applicant: Tokyo Electron Limited, Tokyo (JP)

(72) Inventors: Satoshi Toda, Nirasaki (JP); Naoki Shindo, Nirasaki (JP); Haruna Suzuki, Tokyo (JP); Gen You, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 4 days.

(21) Appl. No.: 17/305,552

(22) Filed: Jul. 9, 2021

(65) Prior Publication Data

US 2022/0020601 A1 Jan. 20, 2022

(30) Foreign Application Priority Data

Jul. 20, 2020 (JP) .................. 2020-123819

(51) Int. Cl.
*H01L 21/321* (2006.01)
*H01L 21/3213* (2006.01)
*H01L 21/768* (2006.01)
*H01L 21/67* (2006.01)

(52) U.S. Cl.
CPC .. *H01L 21/32138* (2013.01); *H01L 21/67069* (2013.01); *H01L 21/76865* (2013.01); *H01L 21/76888* (2013.01)

(58) Field of Classification Search
CPC ......... H01L 21/32138; H01L 21/67069; H01L 21/76865; H01L 21/76888; H01L 21/76877; H01L 21/32135; H01L 21/28562; H01L 21/32051

USPC .......................................................... 216/75
See application file for complete search history.

(56) References Cited

U.S. PATENT DOCUMENTS

| | | | |
|---|---|---|---|
| 5,846,886 A | * 12/1998 | Hattori | H01L 21/76838 257/E21.582 |
| 9,412,608 B2 | 8/2016 | Wang et al. | |
| 2010/0240212 A1 | * 9/2010 | Takahashi | H01L 21/28556 257/E21.585 |

FOREIGN PATENT DOCUMENTS

WO WO-2020054299 A1 * 3/2020 ........... H01L 21/285

* cited by examiner

*Primary Examiner* — Duy Vu N Deo
(74) *Attorney, Agent, or Firm* — Armstrong Teasdale LLP

(57) ABSTRACT

An etching method includes: providing, in a chamber, a substrate including a structure including a first film selected from a molybdenum film and a tungsten film; performing a first etching on the first film by supplying an oxidation gas and a first gas selected from a $MoF_6$ gas and a $WF_6$ gas into the chamber; when a pore present inside the first film is exposed by the first etching, filling the pore with one of molybdenum and tungsten by stopping the first etching and supplying a reduction gas and a second gas selected the $MoF_6$ gas and the $WF_6$ gas into the chamber; and performing a second etching on a filling layer formed in the filling and the first film by supplying the oxidation gas and a third gas selected from the $MoF_6$ gas and the $WF_6$ gas into the chamber.

19 Claims, 10 Drawing Sheets

ETCHING METHOD AND ETCHING APPARATUS

CROSS-REFERENCE TO RELATED APPLICATION

This application is based upon and claims the benefit of priority from Japanese Patent Application No. 2020-123819, filed on Jul. 20, 2020, the entire contents of which are incorporated herein by reference.

TECHNICAL FIELD

The present disclosure relates to an etching method and an etching apparatus.

BACKGROUND

A tungsten (W) film has been used as a conductor film in a semiconductor storage device, and recently, a molybdenum (Mo) film has also been used. Plasma etching and wet etching are generally used for etching a conductor film, such as a W film. For example, Patent Document 1 discloses a method of selectively etching a tungsten film with respect to a silicon-containing film through plasma etching using $Cl_2$ gas, $O_2$ gas, and $N_2$ gas.

PRIOR ART DOCUMENT

Patent Document

Patent Document 1: U.S. Pat. No. 9,412,608

SUMMARY

According to one embodiment of the present disclosure, there is provided an etching method. The etching method includes: providing, in a chamber, a substrate including a structure including a first film selected from a molybdenum film and a tungsten film; performing a first etching on the first film by supplying an oxidation gas and a first gas selected from a $MoF6$ gas and a $WF6$ gas into the chamber; when a pore present inside the first film is exposed by the first etching, filling the pore with one of molybdenum and tungsten by stopping the first etching and supplying a reduction gas and a second gas selected the $MoF6$ gas and the $WF6$ gas into the chamber; and performing a second etching on a filling layer formed in the filling and the first film by supplying the oxidation gas and a third gas selected from the $MoF6$ gas and the $WF6$ gas into the chamber.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

First, a first embodiment will be described.

Figure 1:
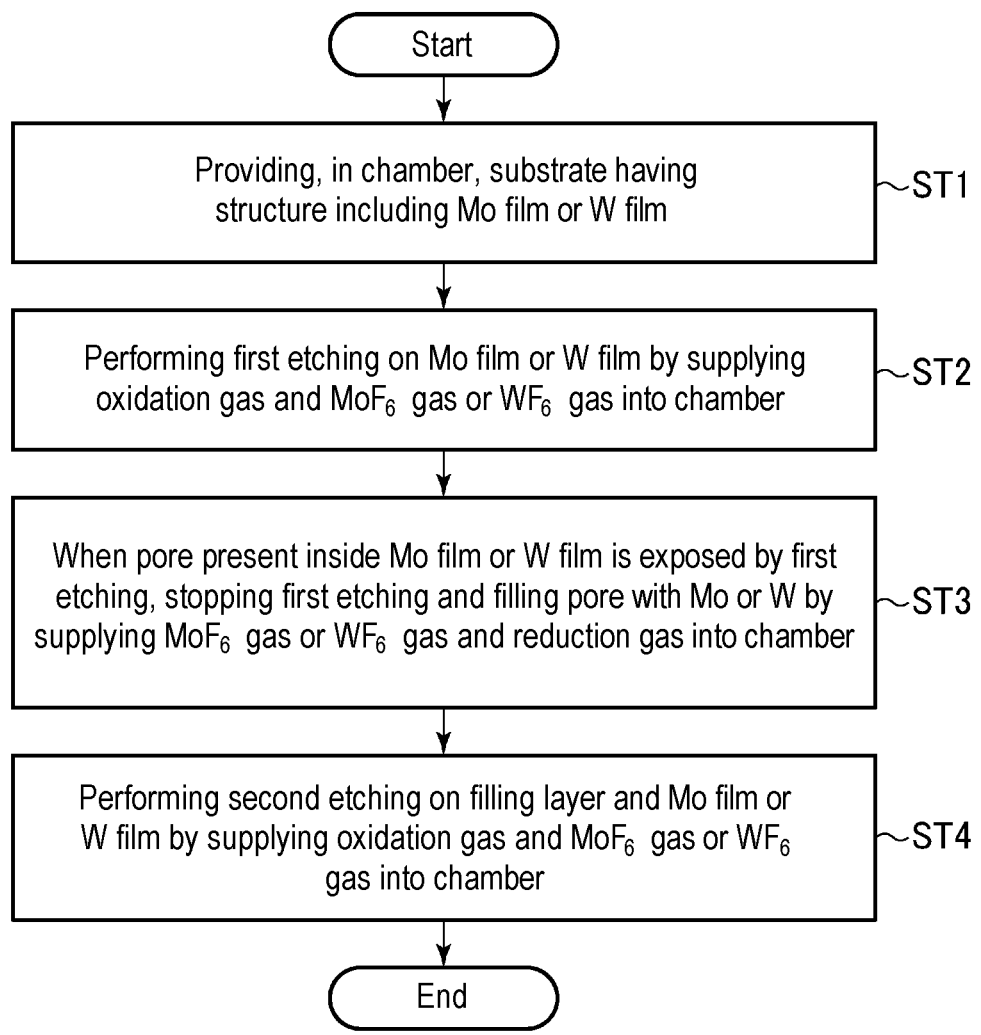
FIG. 1 is a flowchart illustrating an exemplary etching method according to a first embodiment.

FIG. 1 is a flowchart illustrating an exemplary etching method according to a first embodiment.

In the present embodiment, first, a substrate having a structure containing a molybdenum (Mo) film or a tungsten (W) film is provided in a chamber (step ST1). Next, an oxidation gas and $MoF_6$ gas or $WF_6$ gas are supplied into the chamber to perform a first etching on the Mo film or the W film (step ST2). When a pore present inside the Mo film or W film is exposed by the first etching, the first etching is stopped, and $MoF_6$ gas or $WF_6$ gas and a reduction gas are supplied into the chamber so as to fill in the pore with Mo or W (step ST3). Then, an oxidation gas and MoF$_6$ gas or WF$_6$ gas are supplied into the chamber to perform a second etching on a filling layer and the Mo film or W film (step ST4).

A detailed description will follow.

Figure 2:
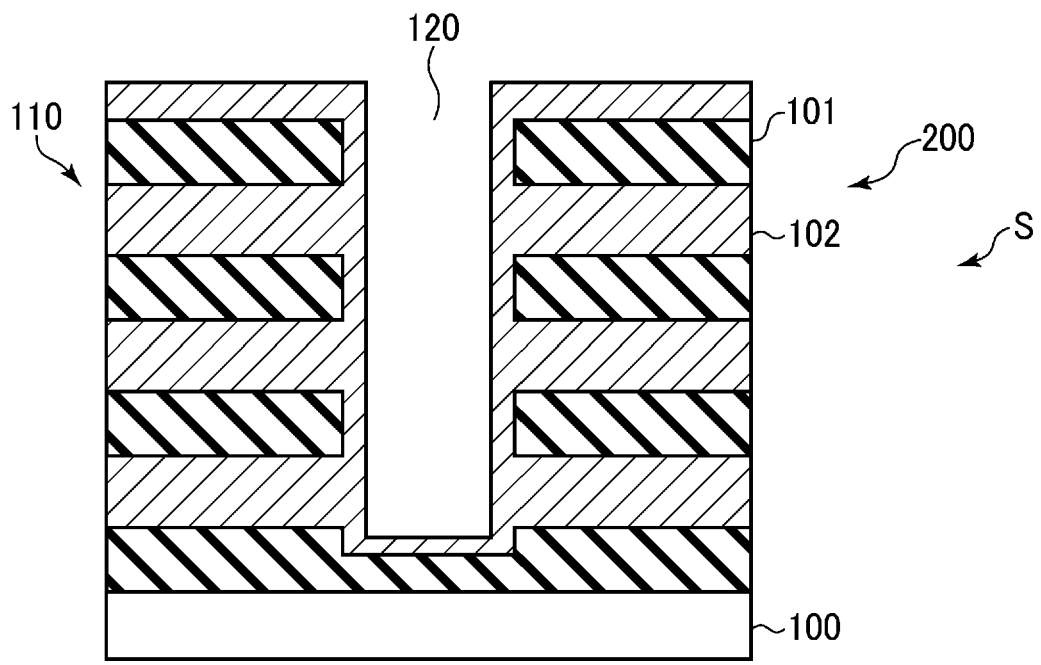
FIG. 2 is a cross-sectional view illustrating an exemplary substrate to be applied to the etching method according to the first embodiment.

The substrate having a structure including a molybdenum (Mo) film or a tungsten (W) film is not particularly limited, but a semiconductor wafer typified by a silicon wafer is exemplified. FIG. 2 illustrates an exemplary substrate. The substrate S is configured using a silicon wafer, and a three-dimensional structure 200 including a Mo film is formed on the silicon substrate 100.

The structure 200 has a laminated portion 110, in which SiO$_2$ films 101 and Mo films 102 are alternately laminated, and a groove (slit) 120 formed in the laminating direction of the laminated portion 110. The Mo film 102 is also formed on the inner wall of the slit 120. The number of laminated layers in the laminated portion 110 is actually about several tens of layers, and the height of the laminated portion is about several μm to 10 μm. W films may be used instead of the Mo films, but in that case, respective barrier films, such as TiN films, are required between the SiO$_2$ films and W films. In the case of the Mo films, respective barrier films, such as Al$_2$O$_3$ films, may be provided between the Mo films and the SiO$_2$ films. Further, instead of SiO$_2$, films of another silicon-containing material, such as Si or SiN, may be used, or films other than silicon-containing material films may be used.

In the substrate S having this structure, the Mo films 102 of the laminated portion 110 are etched through the slit 120.

Figure 3:
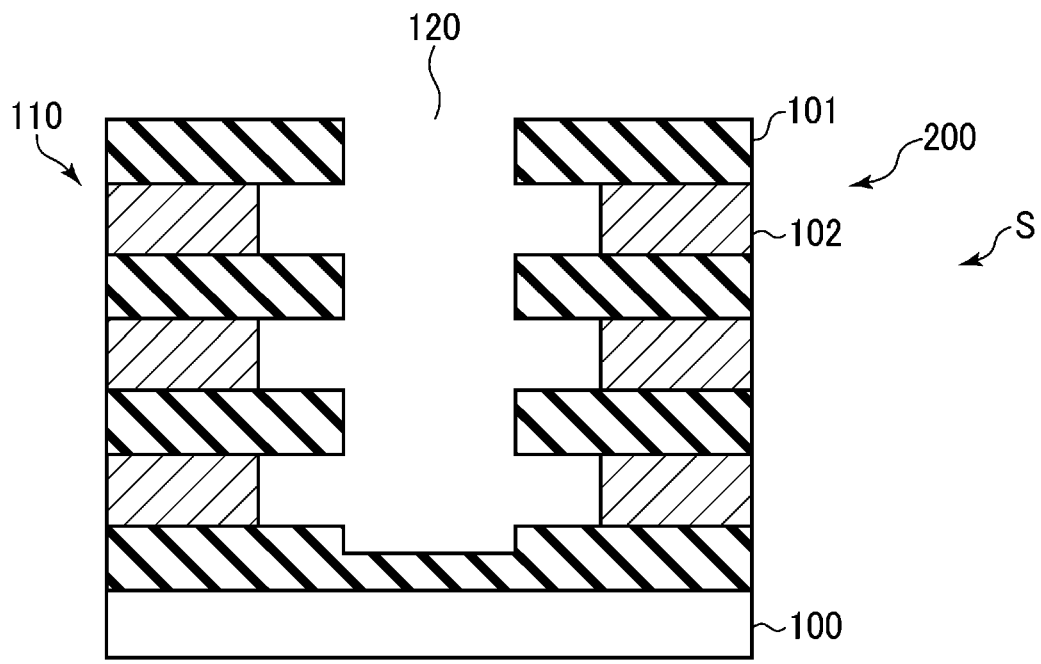
FIG. 3 is a cross-sectional view schematically illustrating the state in which the substrate of FIG. 2 is subjected to a first etching.

The first etching of the next step ST2 is performed by supplying an oxidation gas and MoF$_6$ gas or WF$_6$ gas into the chamber. For example, by etching the substrate S of FIG. 2, the Mo films 102 are etched, as illustrated in FIG. 3. MoF$_6$ gas and WF$_6$ gas are hexafluorides, and are stable fluorides that have a regular octahedral molecular structure in which six fluorine (F) atoms are arranged around an atom of a fluorided element so that F serving as a free radical is not present. MoF$_6$ gas and WF$_6$ gas react with oxides of Mo or W to produce highly volatile acid fluorides such as MoOF$_4$ and WOF$_4$. As a result, the etching of the Mo films or the W films proceeds. Meanwhile, MoF$_6$ gas and WF$_6$ gas hardly react with Si-containing materials. Therefore, it is possible to etch a Mo film or a W film with a high selectivity of 50 or more, even 450 or more, with respect to a Si-containing material, such as a SiO$_2$ film, using an oxidation gas, MoF$_6$ gas, and WF$_6$ gas.

Any gas may be used as the oxidation gas, as long as the gas can oxidize the Mo films or the W films, and O$_2$ gas may be preferably used. Additional examples of the oxidation gas include O$_3$ gas, NO gas, N$_2$O gas, and the like. In addition, it is possible to use either MoF$_6$ gas or WF$_6$ gas for etching the Mo films and the W films. However, it is preferable to use MoF$_6$ gas when etching the Mo films and to use WF$_6$ gas when etching the W films from the viewpoint of reducing the inclusion of impurities into the film as much as possible. In addition to an oxidation gas and a hexafluoride gas, an inert gas, such as N$_2$ gas or Ar gas, may be supplied.

The pressure in the chamber during the first etching may range from 1 to 100 Torr (133.3 to 13330 Pa), and preferably ranges from 10 to 100 Torr (1333 to 13330 Pa). In addition, the temperature at that time may range from 50 to 400 degrees C., preferably ranges from 50 to 300 degrees C. when MoF$_6$ gas is used, and preferably ranges from 200 to 400 degrees C. when WF$_6$ gas is used.

The oxidation gas and the MoF$_6$ gas or the WF$_6$ gas may be supplied into the chamber at the same time, or may be supplied sequentially. In a case in which the gases are supplied sequentially, the oxidation gas is first supplied to oxidize the surface of the Mo films or the W films, and then the MoF$_6$ gas or the WF$_6$ gas is supplied to proceed with the etching, and these are repeated as necessary. In a case in which the gases are supplied at the same time, the ratio of the MoF$_6$ gas or the WF$_6$ gas (XF$_6$ gas) to the oxidation gas (O$_x$)(XF$_6$:O$_x$) may be 10:90 to 99.9:0.1. The preferred range of XF$_6$:O$_x$ is 20:80 to 90:10.

Figure 4:
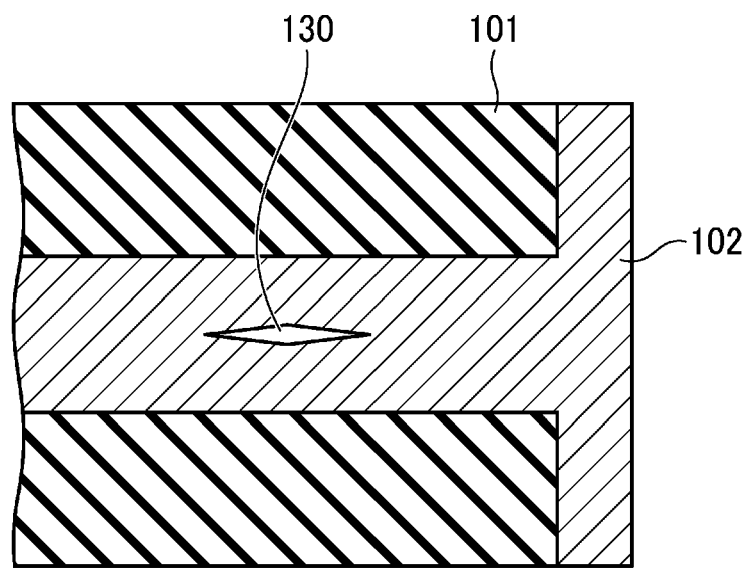
FIG. 4 is a cross-sectional view schematically illustrating the state in which a pit is present in a Mo film on the substrate of FIG. 2.
Figure 5:
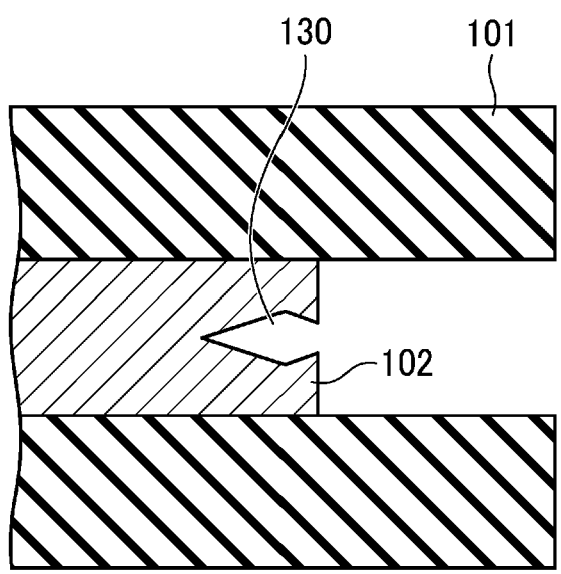
FIG. 5 is a cross-sectional view schematically illustrating the state in which the pit present in the Mo film of the substrate of FIG. 2 is exposed by etching.

A filling process in step ST3 is performed to fill in the pores (hereinafter, referred to as a "pit") in the Mo films or the W films exposed by the first etching in step ST2. For example, in the structure 200 of FIG. 2, when the etching proceeds in the case where a pit 130 is present in a Mo film 102 as illustrated in FIG. 4, exposure of the pit 130 (pitting) is formed, as illustrated in FIG. 5. In this case, when the pit 130 is present in a film, even if the pit 130 is small, it becomes large as illustrated in FIG. 5 by being exposed by etching, which adversely affects a device. Therefore, in step ST3, the first etching is stopped when the pit is exposed, and the pit exposed in step ST2 is filled in.

In order to detect the exposure of the pit, for example, a position of the pit may be detected in advance using a cross-sectional SEM or the like, and a time until the etching reaches the position may also be calculated in advance. When the time has elapsed, it may be determined that the pit is exposed.

Figure 6:
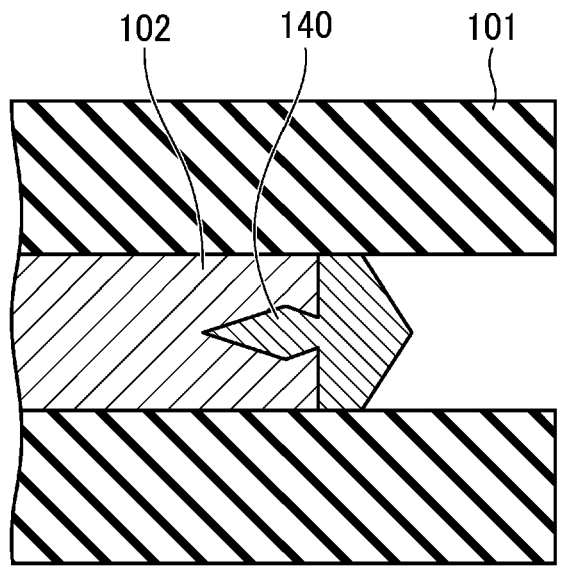
FIG. 6 is a cross-sectional view schematically illustrating the state in which the pit present in the Mo film of the substrate of FIG. 2 is filled with Mo or W.

During the filling, the pit is filled in by depositing Mo or W by supplying MoF$_6$ gas or WF$_6$ gas and a reduction gas into the chamber. For example, in the case of the structure 200 of FIG. 2, as illustrated in FIG. 6, a filling layer 140 is formed by filling the pit 130 formed in the Mo film 102 with Mo or W. FIG. 6 illustrates the case where the Mo film 102 is formed, but the same applies to the case where the filling layer is a W film. Since Mo and W have the same property, WF$_6$ gas may be used to fill in the pit formed in the Mo film, or MoF$_6$ gas may be used to fill in the pit formed in the W film. However, it is preferable to use MF$_6$ gas for the Mo film and to use WF$_6$ gas for the W film so that the filling layer 140 is made of the same material as the target film.

H$_2$ gas is suitable as the reduction gas. In addition to the H$_2$ gas, other reduction gases, such as SiH$_4$ gas and NH$_3$ gas, may also be used. Furthermore, as another gas, an inert gas, such as N$_2$ gas or Ar gas, may be supplied.

The pressure used during the filling in step ST3 may range from 1 to 100 Torr (133 to 13332 Pa), and preferably ranges from 30 to 90 Torr (4000 to 12000 Pa). The temperature at that time may range from 200 to 400 degrees C., and preferably ranges from 250 to 350 degrees C. The flow rate ratio of the MoF$_6$ gas or the WF$_6$ gas to the reduction gas preferably ranges from 1:200 to 1:2.

Figure 7:
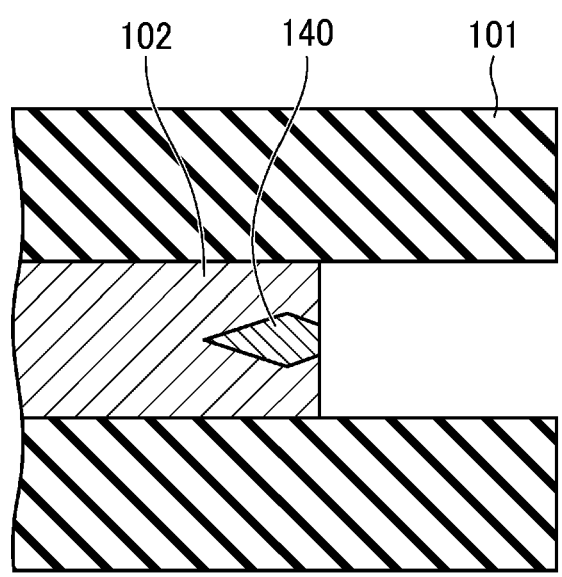
FIG. 7 is a cross-sectional view schematically illustrating the state in which the substrate of FIG. 6 is subjected to a second etching.

The second etching in step ST4 is performed to etch the filling layer and the Mo film or the W film after the filling in step ST3. By this etching, the Mo film or the W film is etched to a predetermined position. For example, in the case of the structure 200 of FIG. 2, the filling layer 140 and the Mo film 102 are etched from the state of FIG. 6 to a predetermined position in the Mo film 102, for example, as illustrated in FIG. 7. The etching at this time may be performed in the same manner as the first etching in step ST2 by supplying the oxidation gas and MoF$_6$ gas or WF$_6$ gas into the chamber.

According to the present embodiment, the pitting, which is formed during the etching of the Mo film or the W film using the oxidation gas and the MoF$_6$ gas or the WF$_6$ gas, is filled with Mo or W using MoF$_6$ gas or the WF$_6$ gas and a reduction gas. This makes it possible to avoid an adverse effect of a device due to the pitting. In addition, since it is possible to perform the filling using a gas of the same type as the etching gas in this way, it is possible to eliminate the pit formed during the film formation of the Mo film or the W film through an extremely simple operation during the etching process. In addition, since Mo or W is formed and filled in the pitting in the Mo film or the W film, it is possible to fill the pitting in the Mo film or the W film with the same metal or the same type of metal, so no problem occurs in a device.

The filling in step ST3 is preferably performed using one of the $MoF_6$ gas and the $WF_6$ gas, that is used in the first etching of step ST2 and the second etching of step ST4. As a result, it is possible to continuously perform a series of processes of steps ST2 to ST4 using an etching apparatus to which a line for supplying a reduction gas, such as $H_2$ gas, is simply added, in addition to the gas lines required for the first etching.

Meanwhile, during the filling in step ST3, the pits are not uniformly present in all Mo films or W films, and some films do not have the pits at an etching stop position. Therefore, when the same amount of film formation is performed on the films having pits therein and the film having no pits therein, the filling heights vary. Therefore, the positions of etching end surfaces of the Mo films or the W films after the etching in step ST4 also vary.

Figure 8:
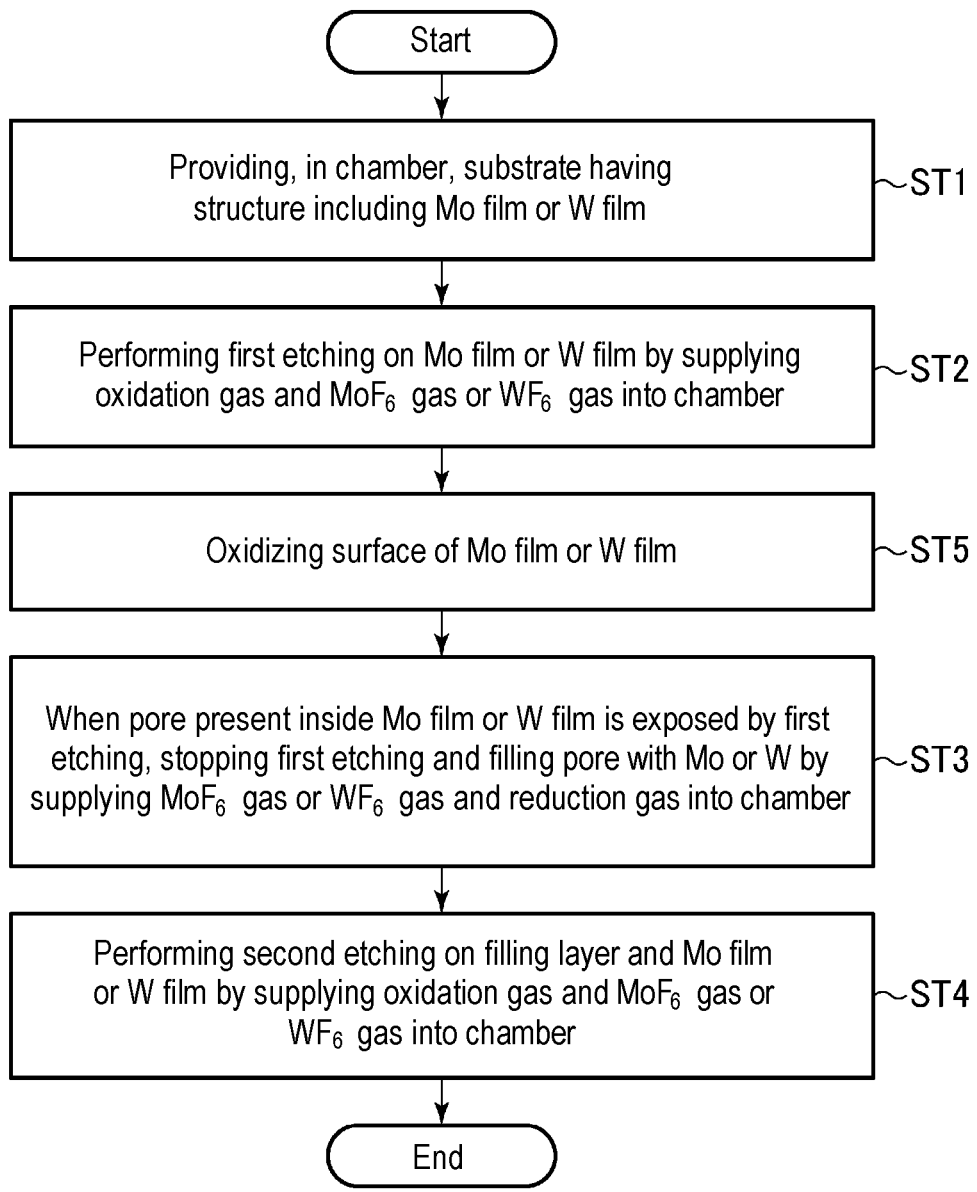
FIG. 8 is a flowchart showing another exemplary etching method according to the first embodiment.

FIG. 8 is a flowchart illustrating another example of the etching method according to the first embodiment, which is capable of solving this problem. As illustrated in FIG. 8, in this example, the surfaces of the Mo films or the W films are oxidized prior to the filling in step ST3 (step ST5). As a result, an oxide layer is formed on the surfaces of the Mo films or the W films.

Figure 9:
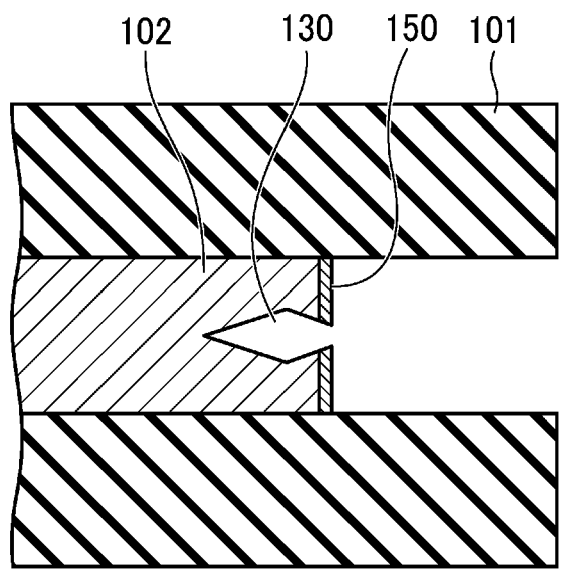
FIG. 9 is a cross-sectional view schematically illustrating the state of an oxidation process performed after performing the first etching on the substrate of FIG. 2.

For example, when this method is applied to the structure 200 of FIG. 2, as illustrated in FIG. 9, an oxide layer 150 is formed on the surfaces of the Mo films 102 after etching in step ST2. Since a Mo film or a W film has a property of being hardly formed on an oxide, almost no Mo film or W film is formed on the oxide layer 150. Meanwhile, since the inside of the pit 130 is a narrow space, it is not easy for oxygen to enter the pit 130, and the inside of the pit 130 is hardly oxidized. Thus, the pit 130 is filled with Mo or W.

Figure 10:
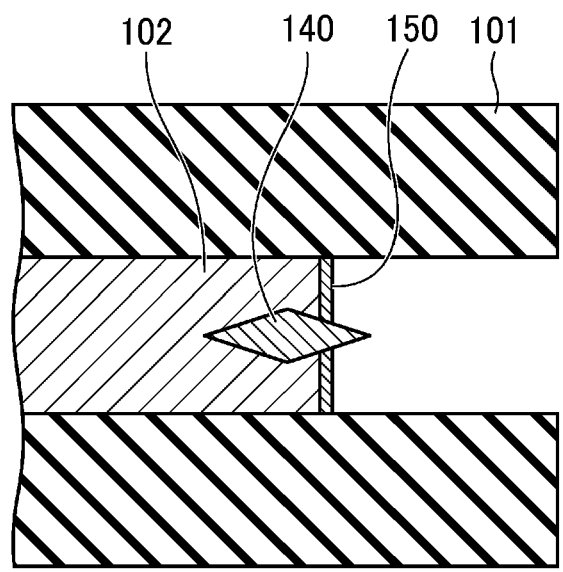
FIG. 10 is a cross-sectional view schematically illustrating the state in which the pit present in the Mo film of the substrate in the state illustrated in FIG. 9 is filled with Mo or W.

That is, when the filling in step S3 is performed after the oxidation process in step ST5, for example, as illustrated in FIG. 10, almost no film is formed on the oxide layer 150, and selective film formation is implemented only in the pit 130. Of course, since the oxide layer 150 is also formed on the Mo films 102 having no pits therein, almost no film is formed thereon. This makes it possible to make the filling height on the films having pits therein and the filling height on the films having no pits therein substantially uniform. Thus, it is possible to make the positions of the etching end surfaces of the Mo films 102 after the etching in step ST4 uniform. The same applies when W films are provided instead of the Mo films.

In the first etching of step ST2, the oxidation gas and $MoF_6$ gas or $WF_6$ gas are used for etching. Therefore, the oxidation process of step ST5 is easily performed using the oxidation gas used in the first etching.

Next, an exemplary etching apparatus used for performing the etching method described above will be described.

Figure 11:
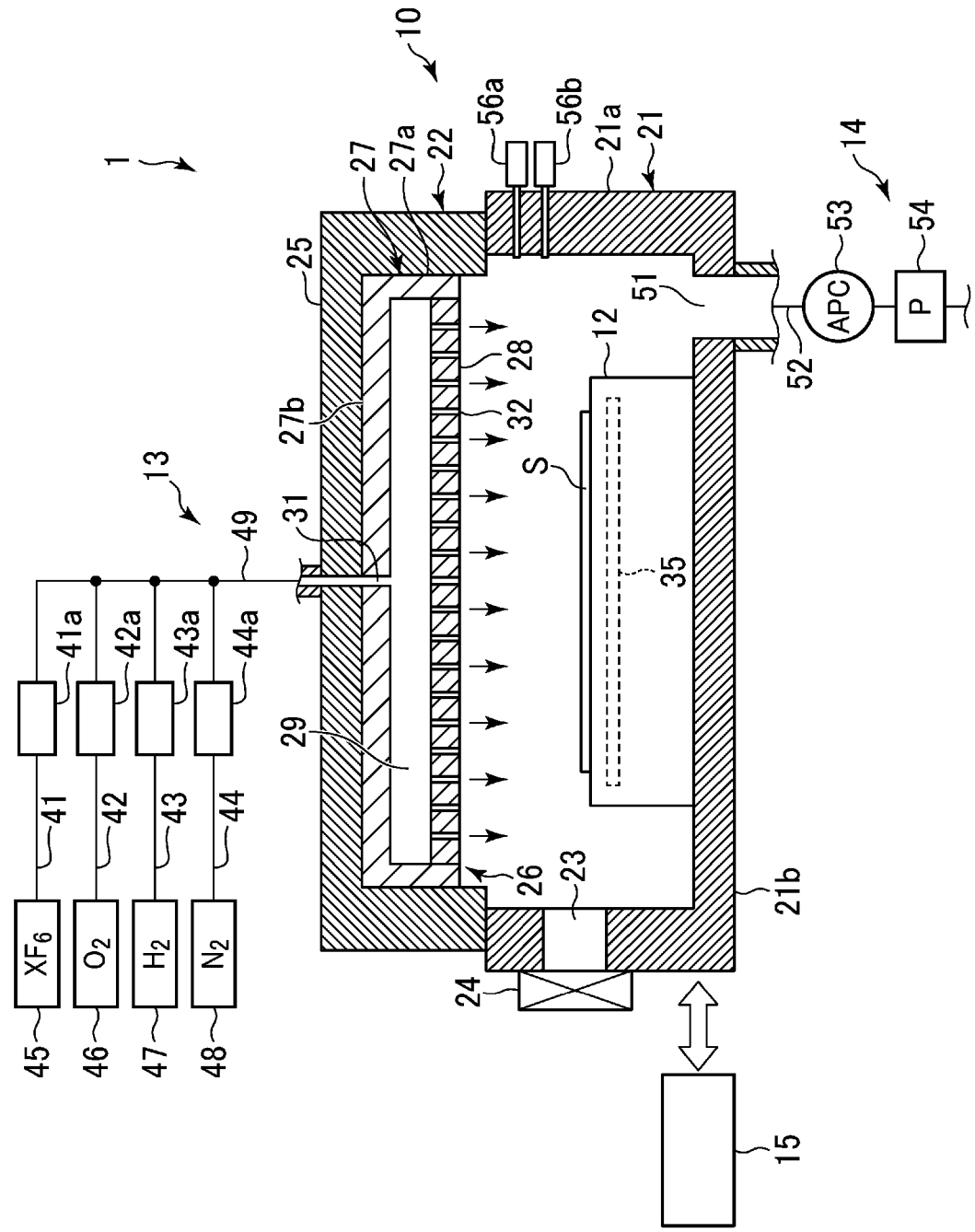
FIG. 11 is a cross-sectional view illustrating an exemplary etching apparatus for performing the etching method according to the first embodiment.

FIG. 11 is a cross-sectional view illustrating an exemplary etching apparatus for performing the etching method according to an embodiment.

As illustrated in FIG. 11, an etching apparatus 1 includes a chamber 10 having a sealed structure. Inside the chamber 10, a stage 12 on which a substrate S is placed in a horizontal state is provided. The substrate S has Mo films or W films, and has, for example, the structure of FIG. 2. The etching apparatus 1 further includes a gas supply mechanism 13 configured to supply an etching gas to the chamber 10, an exhaust mechanism 14 configured to evacuate the inside of the chamber 10, and a controller 15.

The chamber 10 is constituted with a chamber body 21 and a lid 22. The chamber body 21 has a substantially cylindrical side wall 21a and a bottom portion 21b, and has, in the upper portion thereof, an opening that is closed by the lid 22. The side wall 21a and the lid 22 are sealed by a sealing member (not illustrated) so as to ensure the airtightness of the inside of the chamber 10.

The lid 22 has a lid member 25 forming the exterior, and a shower head 26 fitted into the inside of the lid member 25 and installed to face the stage 12. The shower head 26 has a body 27 having a cylindrical side wall 27a and an upper wall 27b, and a shower plate 28 installed in the bottom portion of the body 27. A space 29 is formed between the body 27 and the shower plate 28.

A gas introduction path 31 is formed through the lid member 25 and the upper wall 27b of the body 27 to the space 29, and a pipe 49 of a gas supply mechanism 13, which will be described later, is connected to the gas introduction path 31.

A plurality of gas ejection holes 32 is formed in the shower plate 28, and the gas introduced into the space 29 via the pipe 49 and the gas introduction path 31 is ejected from the gas ejection holes 32 into a space in the chamber 10.

The side wall 21a is provided with a carry-in/out port 23 through which a wafer W is carried in/carried out, and the carry-in/out port 23 is configured to be openable/closable by a gate valve 24.

The stage 12 has a substantially circular shape in a plan view, and is fixed to the bottom portion 21b of the chamber 10. Inside the stage 12, a temperature controller 35 is installed to control the temperature of the stage 12 so as to control the temperature of the substrate S placed on the stage 12. The temperature controller 35 has, for example, a heater configured to heat, for example, the stage 12, and controls the temperature of a substrate S on the stage 12 by controlling the output of the heater using a heater controller (not illustrated). Depending on the temperature of the substrate S, the temperature controller 35 may be provided with a conduit through which a temperature control medium (e.g., water) circulates. In this case, the temperature of the substrate S is controlled by causing the temperature control medium having a predetermined temperature to pass through the conduit. In the vicinity of the substrate S placed on the stage 12, a temperature sensor (not illustrated) is installed to detect the temperature of the substrate S.

The gas supply mechanism 13 includes an $XF_6$ gas supply source 45 configured to supply $MoF_6$ gas or $WF_6$ gas ($XF_6$ gas), an $O_2$ gas supply source 46 configured to supply $O_2$ gas as an oxidation gas, a $H_2$ gas supply source 47 configured to supply $H_2$ gas as a reduction gas, and a $N_2$ gas supply source 48 configured to supply $N_2$ gas as an inert gas, to which one ends of an $XF_6$ gas supply pipe 41, an $O_2$ gas supply pipe 42, a $H_2$ gas supply pipe 43, and a $N_2$ gas supply pipe 44 are connected, respectively. The other ends of the $XF_6$ gas supply pipe 41, the $O_2$ gas supply pipe 42, the $H_2$ gas supply pipe 43, and the $N_2$ gas supply pipe 44 are connected to a common pipe 49, and the pipe 49 is connected to the gas introduction path 31 described above. In the $XF_6$ gas supply pipe 41, the $O_2$ gas supply pipe 42, the $H_2$ gas supply pipe 43, and the $N_2$ gas supply pipe 44, flow rate controllers 41a, 42a, 43a, and 44a for performing opening/closing operations and flow rate control of respective flow paths are installed, respectively. Each of the flow rate controllers 41a, 42a, 43a, and 44a includes, for example, an opening/closing valve and a flow rate controller, such as a mass flow controller.

Accordingly, $MoF_6$ gas or $WF_6$ gas, $O_2$ gas as an oxidation gas, $H_2$ gas as a reduction gas, and $N_2$ gas as an inert gas are supplied into the shower head 26 from respective gas supply sources 45, 46, 47, and 48 via respective pipes 41, 42, 43, and 44 and the pipe 49, and are ejected into the chamber 10 from the gas ejection holes 32 in the shower plate 28.

The exhaust mechanism 14 includes an exhaust pipe 52 connected to an exhaust port 51 formed in the bottom portion 21b of the chamber 10, and further includes an automatic pressure control valve (APC) 53 installed in the exhaust pipe 52 to control the pressure in the chamber 10 and a vacuum pump 54 configured to evacuate the inside of the chamber 10.

Two capacitance manometers 56a and 56b, one for high pressure and one for low pressure, are installed on the side wall of the chamber 10 as pressure gauges for measuring the pressure in the chamber 10 so as to be inserted into the chamber 10. The degree of opening of the automatic pressure control valve (APC) 53 is adjusted based on the values detected by the capacitance manometers 56a and 56b, so that the pressure in the chamber 10 is controlled.

The controller 15 is typically constituted with a computer, and has a main controller having a CPU that controls each component of the etching apparatus 1. In addition, the controller 15 further include an input device (e.g., a keyboard, a mouse, or the like), an output device (e.g., a printer or the like), a display device (e.g., a display or the like), and a storage device (e.g., a non-transitory computer-readable storage medium), which are connected to the main controller. The main controller of the controller 15 causes the etching apparatus 1 to execute a predetermined operation on the basis of, for example, a processing recipe stored in a storage medium built in a storage device or a storage medium set in the storage device.

In such an etching apparatus 1, the substrate S is carried into the chamber 10 and is placed on the stage 12. Then, the temperature controller 35 controls the temperature of the substrate S to a predetermined temperature in the range of, for example, 50 to 400 degrees C., and controls the pressure in the chamber 10 to a predetermined pressure in the range of, for example, 1 to 100 Torr (133.3 to 13332 Pa).

Next, the $O_2$ gas as the oxidation gas and the $MoF_6$ gas or the $WF_6$ gas as the etching gas are simultaneously or sequentially supplied from the gas supply mechanism 13 into the chamber 10 via the shower head 26. As a result, the Mo films or W films of the substrate S are etched (the first etching in step ST2). When sequentially supplied, the oxidation gas is first supplied, after which the $MoF_6$ gas or the $WF_6$ gas is supplied. These steps are repeated as necessary. At this time, $N_2$ gas may be supplied as the inert gas.

Then, when a pit in the Mo films or W films of the substrate S is exposed, the supply of the oxidation gas and the $MoF_6$ gas or the $WF_6$ gas are stopped, and the etching is stopped. Then, after purging the inside of the chamber 10, the temperature of the substrate S is controlled to a predetermined temperature in the range of, for example, 200 to 400 degrees C., by the temperature controller 35 and the pressure in the chamber 10 is controlled to a predetermined pressure in the range of, for example, 1 to 100 Torr (133 to 13332 Pa). Next, the pit is filled in by depositing Mo or W by supplying the $MoF_6$ gas or the $WF_6$ gas and $H_2$ gas as a reduction gas into the chamber 10 from the gas supply mechanism 13 via the shower head 26 (the filling in step ST3 above). At this time, $N_2$ gas, which is an inert gas, may be supplied.

Prior to filling in this pit, $O_2$ gas may be supplied to oxidize the Mo films and the W films (the oxidation process in step ST5 above).

When the filling is completed, the supply of the gas is stopped, the inside of the chamber 10 is purged, and then the Mo films or W films are etched again under the same conditions (the second etching in step ST4).

When the etching is completed, the inside of the chamber 10 is purged, and then the substrate S is carried out from the chamber 10.

Using the etching apparatus illustrated in FIG. 11, a test of filling of a pit exposed by etching of Mo films was conducted on a wafer actually having the structure of FIG. 2. Here, a W film was deposited under the conditions as follows: temperature: 250 to 350 degrees C., pressure: 50 to 90 Torr, flow rate of $WF_6$ gas: 50 to 150 sccm, flow rate of $H_2$ gas: 100 to 600 sccm, flow rate of $N_2$ gas: 50 to 400 sccm, and time: 3 to 10 min. Thereafter, as a result of confirming the state of the films using a TEM-EDX, it was confirmed that the exposed pit was filled with the Mo film.

Second Embodiment

Next, a second embodiment will be described.

Figure 12:
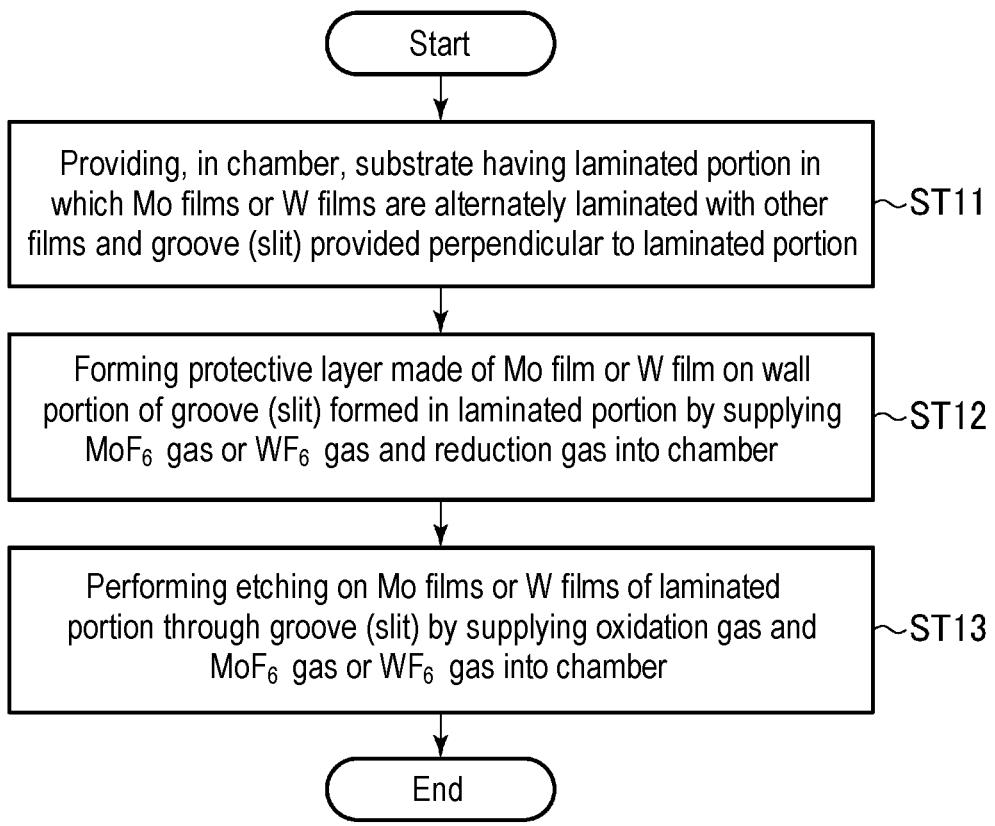
FIG. 12 is a flowchart illustrating an exemplary etching method according to a second embodiment.

FIG. 12 is a flowchart illustrating an exemplary etching method according to a second embodiment.

In the present embodiment, first, a substrate having a laminated portion, in which Mo films or W films are alternately laminated with other films, and a groove (slit), which is provided perpendicular to the laminated portion, is provided in the chamber (step ST11). Next, $MoF_6$ gas or $WF_6$ gas and a reduction gas are supplied into the chamber so as to form a protective layer made of a Mo film or a W film on the wall portion of the groove (slit) formed in the laminated portion (step ST12). Thereafter, an oxidation gas and $MoF_6$ gas or $WF_6$ gas are supplied into the chamber, and the Mo films or the W films of the laminated portion are etched through the groove (slit) (step ST13).

A detailed description will follow.

Figure 13:
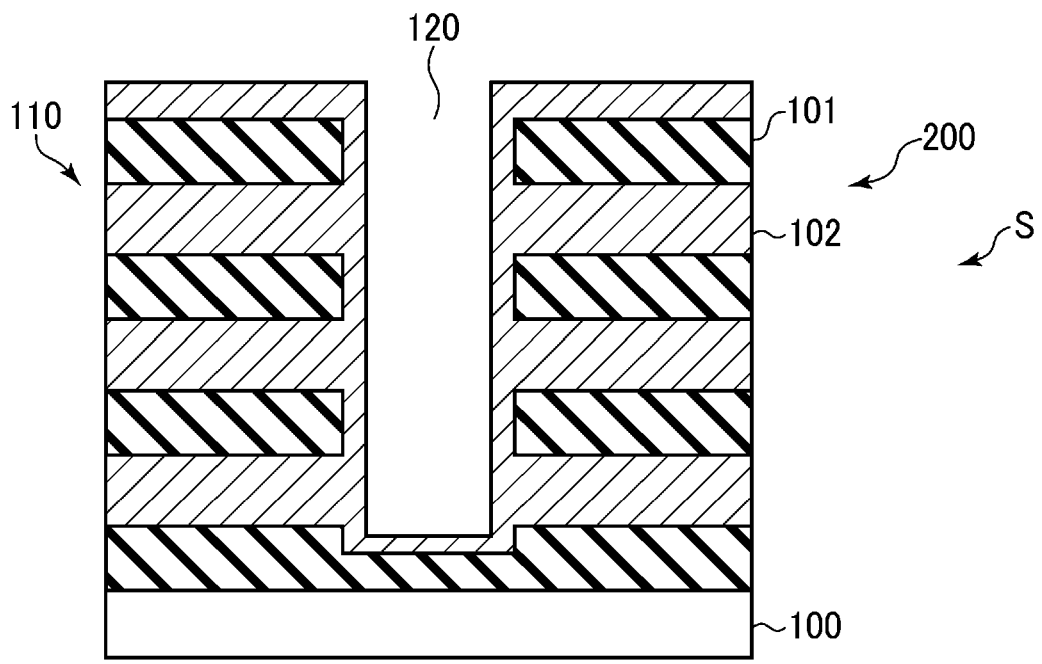
FIG. 13 is a cross-sectional view illustrating an exemplary substrate to be applied to the etching method according to the second embodiment.

The substrate having a laminated portion, in which Mo films or W films are alternately laminated with other films, and a groove (slit), which is provided perpendicular to the laminated portion, is not particularly limited, but a semiconductor wafer typified by a silicon wafer is exemplified. FIG. 13 illustrates a suitable exemplary substrate S, which has the same structure as that of FIG. 2. The substrate S in FIG. 13 is configured using a silicon wafer, and a structure 200 is formed on the silicon substrate 100. The structure 200 has a laminated portion 110, in which $SiO_2$ films 101 and Mo films 102 are alternately laminated, and a groove (slit) 120, which penetrates the laminated portion 110 in the laminating direction. The Mo film 102 is also formed on the inner wall of the slit 120. The number of laminated layers in the laminated portion 110 is actually about several tens of layers, and the height of the laminated portion is about several μm to 10 μm. W films may be used instead of the Mo films, but in that case, respective barrier films, such as TiN films, are required between the $SiO_2$ films and W films. In the case of the Mo films, respective barrier films such as $Al_2O_3$ films may be provided between the Mo films and the $SiO_2$ films. In addition, other Si-containing films may be used instead of the $SiO_2$ films, or films other than Si-containing films may be used.

In the substrate S having this structure, the Mo films 102 of the laminated portion 110 are etched through the slit 120.

Figure 14:
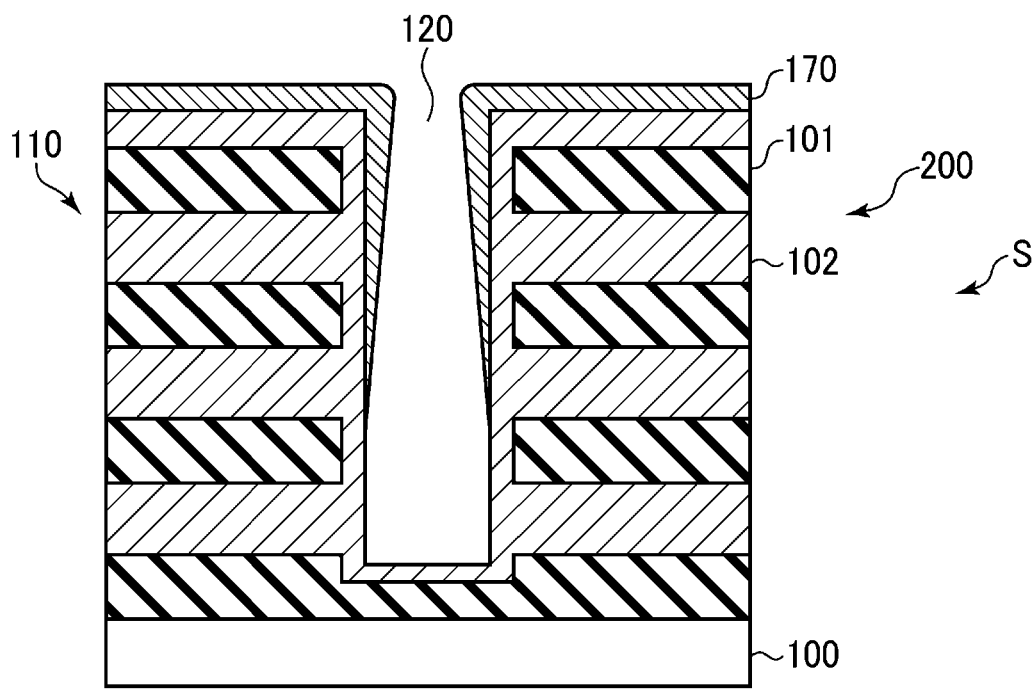
FIG. 14 is a cross-sectional view schematically illustrating the state in which a protective layer is formed on the substrate of FIG. 13.

The formation of the protective layer in the next step ST12 is performed by depositing Mo films or W films on the wall portion of the slit by supplying $MoF_6$ gas or $WF_6$ gas and a reduction gas. For example, as illustrated in FIG. 14, a protective layer 170 made of a Mo film or a W film is formed on the wall portion of the slit 120 by supplying $MoF_6$ gas or $WF_6$ gas and a reduction gas to the substrate S of FIG. 13. At this time, the $MoF_6$ gas or the $WF_6$ gas first reaches the top portion of the laminated portion 110, and at that time, the $MoF_6$ gas or the $WF_6$ gas does not reach the bottom portion of the laminated portion 110. The protective layer 170 is thick at the top portion of the laminated portion 110 and gradually becomes thinner towards the bottom portion of the laminated portion.

The protective layer at this time may be formed under the same conditions as the filling of the pit in step ST3 in the first embodiment. Since Mo and W have the same properties, $WF_6$ gas may be used for forming a protective layer for the laminated portion using Mo films, or $MoF_6$ gas may be used for filling in a pit formed in a W film. However, it is preferable to use $MoF_6$ gas for the Mo film and to use $WF_6$ gas for the W film so that the protective layer is made of the same material as the films to be etched. $H_2$ gas is suitable as the reduction gas. In addition to the $H_2$ gas, other reduction gases, such as $SiH_4$ gas and $NH_3$ gas, may also be used. Furthermore, as another gas, an inert gas, such as $N_2$ gas or Ar gas, may be supplied.

The etching of the next step ST13 is performed by supplying the oxidation gas and $MoF_6$ gas or $WF_6$ gas into the chamber, as in step ST2 of the first embodiment. As a result, the Mo films or the W films are etched through the groove (slit). It is possible to perform etching of the Mo films or the W films at this time with a high selectivity of 50 or more, even 450 or more, with respect to a Si-containing materials, such as a $SiO_2$ film.

The etching at this time may be performed under the same conditions as the first etching of step ST2 of the first embodiment. In addition, as in step ST2 of the first embodiment, the oxidation gas and the $MoF_6$ gas or the $WF_6$ gas may be supplied into the chamber at the same time, or may be supplied sequentially. As the oxidation gas, $O_2$ gas may be preferably used, and in addition, $O_3$ gas, NO gas, $N_2O$ gas, or the like may be used. An inert gas, such as $N_2$ gas or Ar gas, may be supplied.

Further, as in the first etching of step ST2 of the first embodiment, either $MoF_6$ gas or $WF_6$ gas may be used for etching the Mo films and the W films. However, it is preferable to use $MoF_6$ gas when etching the Mo films and to use $WF_6$ gas when etching the W films from the viewpoint of reducing the inclusion of impurities into the film as much as possible.

Figure 15:
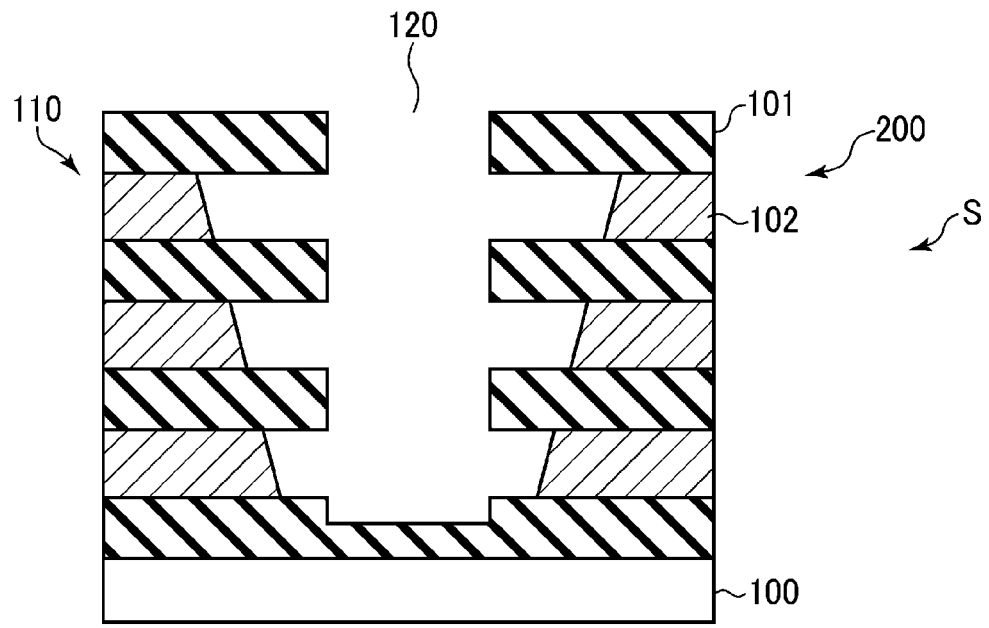
FIG. 15 is a cross-sectional view schematically illustrating the state in which the substrate of FIG. 13 is etched without providing a protective layer.

In the case of etching a substrate having a laminated portion, in which Mo films or W films and other films such as Si-containing films are alternately laminated, when an etching gas is introduced, the etching gas first reaches the top portion of the laminated portion, and etching of the Mo films or the W films is started. At this time point, the etching gas does not reach the bottom portion of the laminated portion having a depth of several μm to 10 μm. As described above, since the etching of the Mo film or the W film of the bottom portion is started with a delay, a loading effect whereby the etching proceeds more in the top portion than in the bottom portion occurs. Therefore, for example, when the substrate S of FIG. 13 is etched as it is, the amount of etching of the Mo films 102 is greater in the top portion, as illustrated in FIG. 15.

Figure 16:
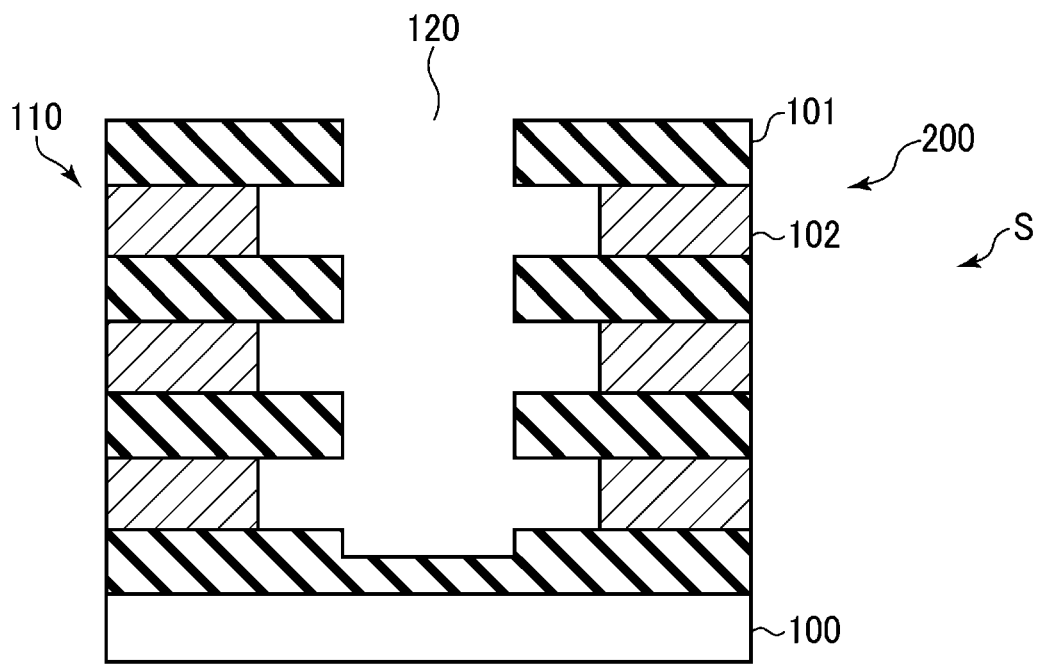
FIG. 16 is a cross-sectional view schematically illustrating the state in which a substrate provided with the protective layer illustrated in FIG. 14 is etched.

Therefore, in the present embodiment, in step ST12, $MoF_6$ gas or $WF_6$ gas and a reduction gas are supplied to the substrate so as to form a protective layer made of a Mo film or a W film. At this time, for example, as illustrated in FIG. 14 described above, the protective layer 170 is thick in the top portion of the laminated portion and gradually becomes thinner towards the bottom portion of the laminated portion. Thus, it is possible to reduce the loading effect during the etching. That is, since the protective layer 170 is thick in the top portion, in which etching is likely to proceed, and the protective layer 170 is thin in the bottom portion in which etching is difficult to proceed, it is possible to delay the progress of etching in the top portion, and thus it is possible to reduce the loading effect. Therefore, for example, by forming the protective layer 170 on the substrate S of FIG. 13 and then performing etching, it is possible to enhance the etching uniformity of the Mo films 102, as illustrated in FIG. 16. The same applies to the case in which a W film is used instead of the Mo film.

In addition, since it is possible to form the protective layer using the same type of gas as the etching gas, it is possible to easily form and etch the protective layer using a series of operations. Furthermore, since the protective layer made of a Mo film or a W film is formed on the Mo films or the W films using the same type of $MoF_6$ gas or $WF_6$ gas, no problem occurs in a device.

In addition, when forming the protective layer in step ST12, it is preferable to use the gas used in step ST13 among $MoF_6$ gas and $WF_6$ gas. As a result, it is possible to continuously perform steps ST12 and ST13 using an etching apparatus to which a line for supplying a reduction gas, such as $H_2$ gas, is simply added, in addition to the gas lines required for etching.

When performing the etching method according to the second embodiment, it is also possible to perform formation of a protective film using $MoF_6$ gas or $WF_6$ gas and a reduction gas (step ST12) and etching using an oxidation gas and $MoF_6$ gas or $WF_6$ gas (step ST13) in the same procedure as the first embodiment using the etching apparatus of FIG. 11 used in the first embodiment.

In the etching apparatus of FIG. 11, a protective layer made of a W film was formed on a wafer having the structure of FIG. 13 including a laminated portion (having a depth of about 10 μm) in which several tens of $SiO_2$ films and Mo films were actually laminated repeatedly under the following conditions.

Temperature: 250 to 350 degrees C., pressure: 50 to 90 Torr, flow rate of $WF_6$ gas: 50 to 150 sccm, flow rate of $H_2$ gas: 100 to 600 sccm, flow rate of $N_2$ gas: 50 to 400 sccm, and time: 3 to 10 min As a result of measuring the thickness of the protective layer, it was confirmed that the protective layer was 9 to 80 nm in the top portion and 5 to 50 nm in the bottom portion, so that a thick protective layer was formed in the top portion and a thin protective layer was formed in the bottom portion.

Then, etching was performed using $O_2$ gas, $WF_6$ gas, and $N_2$ gas under the following conditions.

Temperature: 250 to 350 degrees C., pressure: 50 to 90 Torr, flow rate of $WF_6$ gas: 300 to 500 sccm, flow rate of $O_2$ gas: 300 to 500 sccm, flow rate of $N_2$ gas: 100 to 400 sccm, and time: 1 to 5 min As a result of confirming the etching amount, the etching amount was 18 to 22 nm in the top portion and 17 to 23 nm in the bottom portion. When there was no protective layer, the etching amount was 22 to 24 nm in the top portion and 17 to 20 nm in the bottom portion. Thus, it was confirmed that the loading effect was reduced by forming the protective layer.

In the second embodiment, as the etching process after the formation of the protective layer in step ST12, the first etching (step ST2), the filling of a pit (step ST3), and the second etching (step ST4) of the first embodiment may be performed. As a result, in addition to reducing the loading effect, it is possible to fill in a pit during the etching process.

<Other Applications>

Although embodiments have been described above, it should be considered that the embodiments disclosed herein are illustrative and are not restrictive in all respects. The embodiments described above may be omitted, replaced, or modified in various forms without departing from the scope and spirit of the appended claims.

For example, the structural examples of the substrates illustrated in FIGS. 2 and 13 are merely examples, and the present disclosure is not limited thereto. In addition, the configuration of the etching apparatus is merely an example, and is not particularly limited as long as the etching is performed using a gas without plasma.

The case where a semiconductor wafer is used as the substrate has been described, but the substrate is not limited to the semiconductor wafer. The substrate may be another substrate, such as a flat panel display (FPD) substrate, represented by a liquid crystal display (LCD) substrate or a ceramic substrate.

According to the present disclosure, an etching method and an etching apparatus capable of satisfactorily etching a molybdenum film or a tungsten film are provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method comprising:
   providing, in a chamber, a substrate including a structure including a first film selected from a molybdenum film and a tungsten film, a pore being formed in the first film;
   performing a first etching on the first film by supplying an oxidation gas and a first gas selected from a $MoF_6$ gas and a $WF_6$ gas into the chamber while determining whether the pore present inside the first film is exposed by the first etching;
   in response to determining that the pore present inside the first film is exposed by the first etching, stopping the first etching and filling the pore with one of molybdenum and tungsten by supplying a reduction gas and a second gas selected from the $MoF_6$ gas and the $WF_6$ gas into the chamber; and
   performing a second etching on a filling layer formed in the filling and a portion of the first film that is left after the first etching by supplying the oxidation gas and a third gas selected from the $MoF_6$ gas and the $WF_6$ gas into the chamber.

2. The etching method of claim 1, wherein the substrate further includes a laminated portion, in which the first film and a second film are laminated, and a groove, which is formed in a laminating direction of the laminated portion, and
   wherein the first film is etched through the groove.

3. The etching method of claim 2, wherein the second film is a silicon-containing film.

4. The etching method of claim 3, further comprising:
   oxidizing a surface of the first film after the performing the first etching and before the filling.

5. The etching method of claim 4, wherein the first gas in the first etching, the second gas in the filling, and the third gas in the second etching are the same.

6. The etching method of claim 5, wherein a gas selected from a $H_2$ gas, a $SiH_4$ gas, and a $NH_3$ gas is used as the reduction gas.

7. The etching method of claim 6, wherein a pressure in the chamber in the filling ranges from 133 to 13,332 Pa.

8. The etching method of claim 7, wherein a temperature of the substrate in the filling ranges from 200 to 400 degrees C.

9. The etching method of claim 8, wherein, in the first etching and the second etching, a gas selected from an $O_2$ gas, an $O_3$ gas), a NO gas, and a $N_2O$ gas is used as the oxidation gas.

10. The etching method of claim 9, wherein the pressure in the chamber in the first etching and the second etching ranges from 133.3 to 13,330 Pa.

11. The etching method of claim 10, wherein the temperature of the substrate in the first etching and the second etching ranges from 50 to 400 degrees C.

12. The etching method of claim 1, further comprising:
    oxidizing a surface of the first film after the performing the first etching and before the filling.

13. The etching method of claim 1, wherein the first gas in the first etching, the second gas in the filling, and the third gas in the second etching are the same.

14. The etching method of claim 1, wherein a gas selected from a $H_2$ gas, a $SiH_4$ gas, and a $NH_3$ gas is used as the reduction gas.

15. An etching method comprising:
    providing, in a chamber, a substrate including:
       a laminated portion, in which a first film that is selected from a molybdenum film or a tungsten film and includes a pore formed therein, and a second film are alternately laminated; and
       a groove, which is formed perpendicular to the laminated portion;
    forming a protective layer made of one of the molybdenum film and the tungsten film on a wall portion of the groove formed in the laminated portion by supplying a reduction gas and a first gas selected from a $MoF_6$ gas and a $WF_6$ gas into the chamber; and
    etching the first film of the laminated portion through the groove by supplying an oxidation gas and one of the $MoF_6$ gas and the $WF_6$ gas into the chamber,
    wherein the etching the first film of the laminated portion includes:
       performing a first etching on the first film by supplying the oxidation gas and a second gas selected from the $MoF_6$ gas and the $WF_6$ gas into the chamber while determining whether the pore present inside the first film is exposed by the first etching;
       in response to determining that the pore present inside the first film is exposed by the first etching, stopping the first etching and filling the pore with one of molybdenum and tungsten by supplying the reduction gas and a third gas selected from the MoF$_6$ gas and the WF$_6$ gas into the chamber; and performing a second etching on a filling layer formed in the filling and a portion of the first film that is left after the first etching by supplying the oxidation gas and a fourth gas selected from the MoF$_6$ gas and the WF$_6$ gas into the chamber.

16. The etching method of claim 15, wherein the second film is a silicon-containing film.

17. The etching method of claim 15, wherein, in the forming the protective layer, a gas selected from a H$_2$ gas, a SiH$_4$ gas, and a NH$_3$ gas is used as the reduction gas.

18. The etching method of claim 15, wherein, in the etching, a gas selected from an O$_2$ gas, an O$_3$ gas), a NO gas, and a N$_2$O gas is used as the oxidation gas.

19. An etching method comprising:
providing, in a chamber, a substrate including a structure including a first film selected from a molybdenum film and a tungsten film, a pore being formed in the first film;

performing a first etching on the first film by supplying an oxidation gas and a first gas selected from a MoF$_6$ gas and a WF$_6$ gas into the chamber while determining whether the pore present inside the first film is exposed by the first etching;

in response to determining that the pore present inside the first film is exposed by the first etching, stopping the first etching and subsequently oxidizing a surface of the first film;

after the oxidizing, filling the pore with one of molybdenum and tungsten by supplying a reduction gas and a second gas selected from the MoF$_6$ gas and the WF$_6$ gas into the chamber; and performing a second etching on a filling layer formed in the filling and the first film by supplying the oxidation gas and a third gas selected from the MoF$_6$ gas and the WF$_6$ gas into the chamber.

* * * * *